US011173608B2

(12) United States Patent
Suzuki et al.

(10) Patent No.: US 11,173,608 B2
(45) Date of Patent: Nov. 16, 2021

(54) WORK ROBOT AND WORK POSITION CORRECTION METHOD

(71) Applicant: FUJI CORPORATION, Chiryu (JP)

(72) Inventors: Masato Suzuki, Chiryu (JP);
Masatoshi Fujita, Anjo (JP)

(73) Assignee: FUJI CORPORATION, Chiryu (JP)

( * ) Notice: Subject to any disclaimer, the term of this patent is extended or adjusted under 35 U.S.C. 154(b) by 307 days.

(21) Appl. No.: 16/348,574

(22) PCT Filed: Nov. 17, 2016

(86) PCT No.: PCT/JP2016/084075
§ 371 (c)(1),
(2) Date: May 9, 2019

(87) PCT Pub. No.: WO2018/092236
PCT Pub. Date: May 24, 2018

(65) Prior Publication Data
US 2020/0189108 A1 Jun. 18, 2020

(51) Int. Cl.
*B25J 9/16* (2006.01)
*B25J 9/06* (2006.01)
*B25J 9/12* (2006.01)

(52) U.S. Cl.
CPC ............ *B25J 9/1684* (2013.01); *B25J 9/06* (2013.01); *B25J 9/12* (2013.01); *B25J 9/161* (2013.01); *B25J 9/1674* (2013.01); *B25J 9/1694* (2013.01)

(58) Field of Classification Search
CPC .................. B25J 9/16; B25J 9/06; B25J 9/12
See application file for complete search history.

(56) References Cited

U.S. PATENT DOCUMENTS

2003/0144809 A1* 7/2003 Puchtler ............... G05B 19/404
702/105
2010/0207567 A1 8/2010 Mori et al.
(Continued)

FOREIGN PATENT DOCUMENTS

JP 60-205713 A 10/1985
JP 61-90205 A 5/1986
(Continued)

OTHER PUBLICATIONS

International Search Report dated Feb. 7, 2017 in PCT/JP2016/084075 filed on Nov. 17, 2016.
(Continued)

*Primary Examiner* — Kira Nguyen
(74) *Attorney, Agent, or Firm* — Oblon, McClelland, Maier & Neustadt, L.L.P.

(57) ABSTRACT

An articulated robot includes an arm, an actuator, a storage device, and a control device. The storage device stores the correction parameter for correction accuracy required for each of the multiple work regions, which are segmented as the regions in which work on the work target object is performed in the movable region of the robot arm. When the work is instructed with designation of the target position, the control device acquires, from the storage device, a correction parameter corresponding to a work region to which the designated target position belongs, among the multiple work regions. Then, the control device controls the actuator by correcting the target position using the acquired correction parameter.

10 Claims, 9 Drawing Sheets

(56) References Cited

U.S. PATENT DOCUMENTS

| | | | |
|---|---|---|---|
| 2010/0244762 A1 | 9/2010 | Mori et al. | |
| 2012/0239194 A1* | 9/2012 | Kagawa | B25J 9/1692 |
| | | | 700/254 |
| 2014/0229005 A1* | 8/2014 | Suzuki | B25J 9/1697 |
| | | | 700/254 |
| 2015/0158176 A1 | 6/2015 | Fujita et al. | |
| 2016/0059419 A1* | 3/2016 | Suzuki | B25J 9/1697 |
| | | | 700/114 |
| 2016/0263747 A1* | 9/2016 | Yokoi | B25J 9/1692 |
| 2016/0297069 A1* | 10/2016 | Negishi | B25J 9/1638 |
| 2017/0007342 A1* | 1/2017 | Kasai | A61B 90/361 |
| 2017/0066131 A1* | 3/2017 | Kamikawa | B25J 9/1697 |
| 2017/0326727 A1* | 11/2017 | Kimura | B25J 9/1605 |

FOREIGN PATENT DOCUMENTS

| | | |
|---|---|---|
| JP | 2009-148850 A | 7/2009 |
| JP | 2011-173234 A | 9/2011 |

OTHER PUBLICATIONS

Extended European Search Report dated Oct. 21, 2019, in Patent Application No. 16921621.5, citing documents AA-AD therein, 7 pages.

* cited by examiner

WORK ROBOT AND WORK POSITION CORRECTION METHOD

TECHNICAL FIELD

This specification discloses a work robot and a work position correction method.

BACKGROUND ART

Conventionally, as a type of work robot, there has been proposed a robot where the operation of the robot is controlled by applying Denavit-Hartenberg (DH) parameters to a target point to perform coordinate transformation (see Patent Document 1, for example). The setting of the DH parameters is performed as follows. That is, a control device of the robot divides the operation space of the robot into multiple regions, and sets a measurement point for each divided region. Next, the control device moves the robot to the measurement point to acquire three-dimensional position data. Then, the control device derives the DH parameter from the error between the acquired position data and the measurement point. When controlling the operation of the robot based on the target point, the control device selects the DH parameter of the region to which the target point belongs from the DH parameters derived for each of multiple regions, and applies the selected DH parameter to the target point to perform coordinate transformation.

PATENT LITERATURE

Patent Literature 1: JP-A-2009-148850

BRIEF SUMMARY

Technical Problem

However, in the work robot described above, even if the DH parameter used for coordinate transformation is optimized, sufficient work accuracy may not be ensured in some cases. For example, if an error (for example, distortion of an arm) that cannot be corrected by optimization of the DH parameter is included, the work robot cannot move to an accurate position due to the influence of the error. On the other hand, when a work robot performs a work on multiple work target objects, the work accuracy required for each work may be different. However, in many cases a manufacturer manufactures the work robot such that the same work accuracy is guaranteed for all the work target objects. Thus, the manufacturer must manufacture and adjust the work robot in accordance with the work requiring the highest work accuracy, which results in excessive work accuracy for other works.

An object of the present disclosure is to ensure necessary and sufficient work accuracy when operating a work robot by designating a target position.

Solution to Problem

The present disclosure employs the following means in order to achieve the above-mentioned main object.

A work robot of the present disclosure includes a multi-joint type robot arm, an actuator configured to drive each joint of the robot arm, a storage device configured to store a correction parameter for correction accuracy required for each of multiple work regions segmented as regions in which work on a work target object is performed in a movable region of the robot arm, and a control device configured to control the actuator when the work is instructed with designation of a target position, by acquiring, from the storage device, a correction parameter corresponding to a work region, to which the designated target position belongs, among the multiple work regions, and by correcting the target position using the acquired correction parameter.

The work robot of the present disclosure includes a robot arm, an actuator, a storage device, and a control device. The storage device stores the correction parameter for correction accuracy required for each of the multiple work regions, which are segmented as the regions in which work on the work target object is performed in the movable region of the robot arm. When the work is instructed with the designation of the target position, the control device controls the actuator by acquiring the correction parameter corresponding to the work region, to which the designated target position belongs among the multiple work areas, and by correcting the target position using the acquired correction parameter. The correction parameter may be set to a necessary correction accuracy for each of the multiple work regions, and an excessive correction accuracy is unnecessary. Therefore, according to the work robot of the present disclosure, it is possible to ensure necessary and sufficient accuracy when the work robot is operated by designating the target position.

The work position correction method of the present disclosure is a work position correction method used in operating a multi-joint type work robot by designating a target position, including setting multiple work regions as regions in which work on a work target object is performed in a movable area of the work robot, setting a correction parameter for correction accuracy required for each of the set multiple work regions, and correcting the target position using a correction parameter corresponding to a work region which belongs to the target position among the set correction parameters to control the operation of the work robot.

In the work position correction method of the present disclosure, first, the multiple working regions are set as the regions in which the works are performed on the work target object in the movable area of the robot arm. Next, in the work position correction method, the correction parameter for correction accuracy required for each of the set multiple work regions are set. In the work position correction method, the target position is corrected using the correction parameter corresponding to the work region that belongs to the target position among the set correction parameters, so as to control the operation of the work robot. The correction parameter may be set to a necessary correction accuracy for each of the multiple work regions, and an excessive correction accuracy is unnecessary. Therefore, according to the work position correction method of the present disclosure, it is possible to ensure necessary and sufficient accuracy when the work robot is operated by designating the target position.

DESCRIPTION OF EMBODIMENTS

Next, embodiments of the present disclosure will be described with reference to the drawings.

Figure 1:
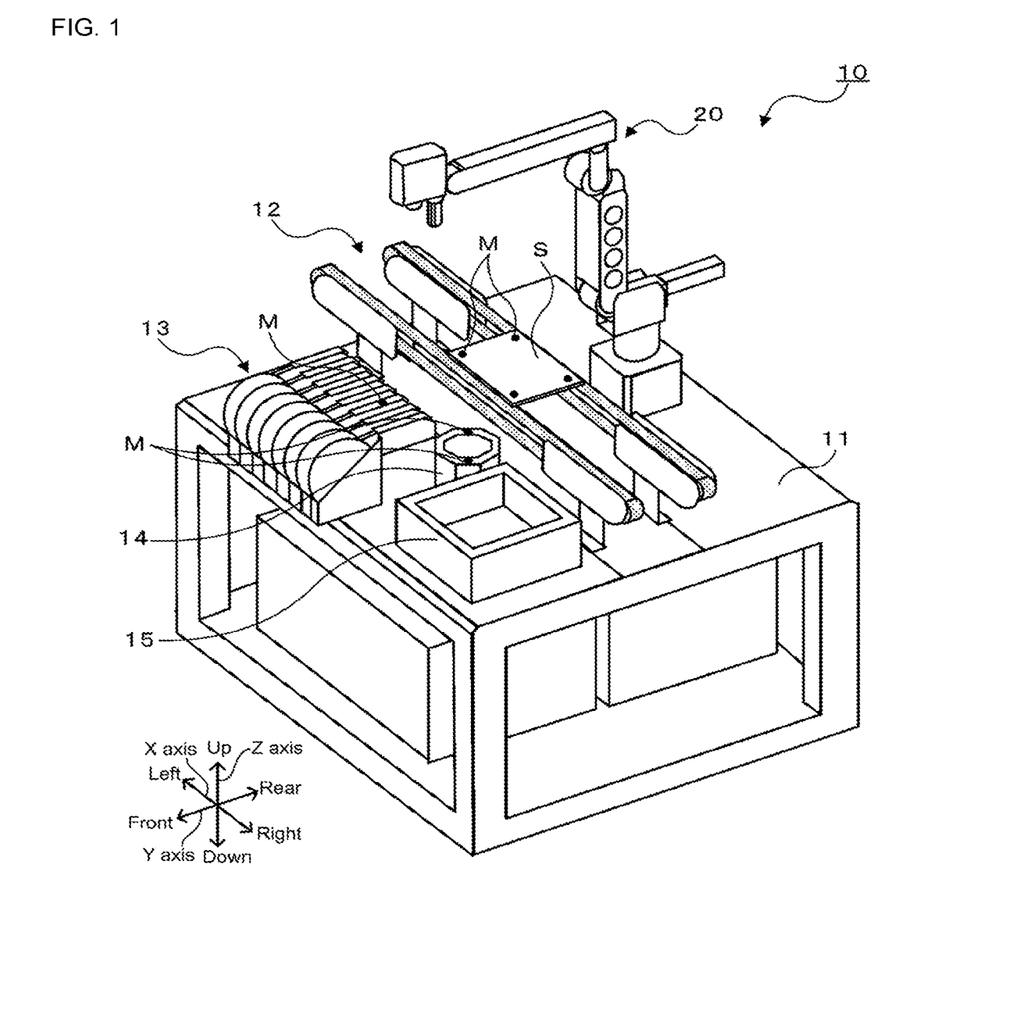
FIG. 1 is a configuration diagram illustrating an outline of a configuration of robot system 10.
Figure 2:
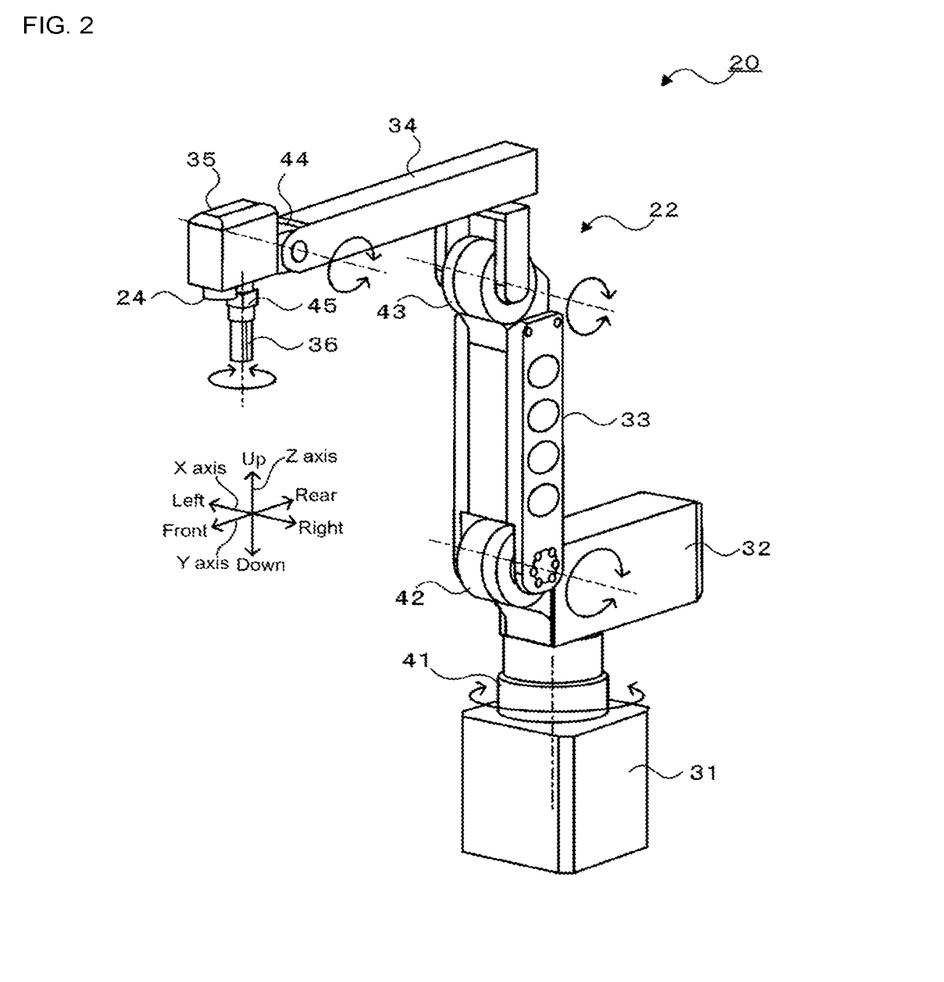
FIG. 2 is a configuration diagram illustrating an outline of the configuration of robot 20.
Figure 3:
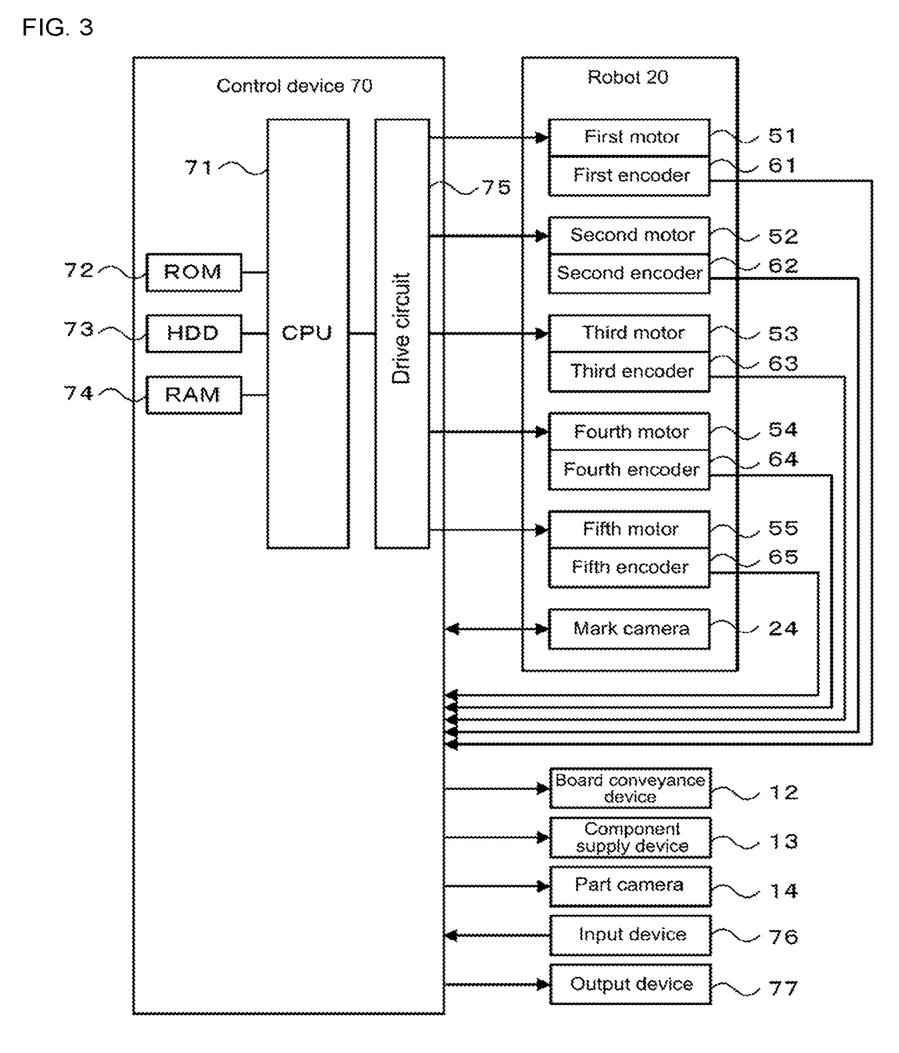
FIG. 3 is a block diagram illustrating electrical connections between robot 20 and control device 70.

FIG. 1 is a configuration diagram illustrating an outline of a configuration of a robot system 10. FIG. 2 is a configuration diagram illustrating an outline of the configuration of the robot 20. FIG. 3 is a block diagram illustrating an electrical connection relationship between robot 20 and control device 70. In FIGS. 1 and 2, the front-rear direction is the X-axis direction, the left-right direction is the Y-axis direction, and the up-down direction is the Z-axis direction.

Robot system 10 includes robot 20 and control device 70 that controls robot 20. Robot system 10 is configured as a system for picking up a workpiece and placing the picked-up workpiece on a target object. In the present embodiment, robot system 10 is configured as a component mounting system that picks up components and mounts the components on board S. The robot system is not limited to the system described above, and can be applied to any system as long as it is a system that performs work on a workpiece using robot 20.

The robot 20 includes a five-axis vertical articulated arm (hereinafter referred to as an arm) 22 and an end effector (not shown) which is a tip of the robot 20. Arm 22 includes six links (first to sixth links 31 to 36) and five joints (first to fifth joints 41 to 45) for rotatably or pivotally connecting the respective links. Each joint (first to fifth joints 41 to 45) includes a motor (first to fifth motors 51 to 55) for driving the corresponding joint, and an encoder (first to fifth encoders 61 to 65) for detecting the rotation angle of the corresponding motor. In the present embodiment, the motor is a servomotor and the encoder is a rotary encoder. An end effector is attached to the tip link (sixth link 36) of arm 22 and is capable of holding and releasing a component (workpiece). As the end effector, for example, a mechanical chuck, a suction nozzle, an electromagnet, or the like can be used. Mark camera 24 for capturing a mark M attached to an object such as a work target object installed on work table 11 is attached to arm 22 (fifth link 35).

Proximal link (first link 31) of arm 22 is fixed to work table 11. In work table 11, board conveyance device 12, component supply device 13, part camera 14, discard box 15, and the like are disposed. In the present embodiment, board conveyance device 12 has a pair of belt conveyors spanned in the left-right direction (X-axis direction) at intervals in the front-rear direction (Y-axis direction). Board S is conveyed from left to right by the belt conveyor. In the present embodiment, component supply device 13 is configured as a tape feeder for feeding a tape in which multiple components are accommodated at predetermined intervals rearward (in the Y-axis direction). Component supply device 13 is not limited to the tape feeder, and may be any type of component supply device, for example, a tray feeder for supplying a tray in which multiple components are arranged. Part camera 14 captures an image of a component held by the end effector when the component passes over part camera 14, and outputs the captured image to control device 70. Discard box 15 is a box for discarding a component in which an error has occurred.

Control device 70 is configured as a microprocessor in which CPU 71 is a main unit, and includes ROM 72, HDD 73, RAM 74, drive circuit 75, and the like in addition to CPU 71. Drive circuit 75 is a circuit for driving first to fifth motors 51 to 55. Signals are input to control device 70 from first to fifth encoders 61 to 65, part camera 14, mark camera 24, input device 76, and the like. Control device 70 outputs signals to board conveyance device 12, component supply device 13, output device 77, and first to fifth motors 51 to 55. Input device 76 is an input device through which an operator performs an input operation. Output device 77 is a display device for displaying various types of information.

Figure 4:
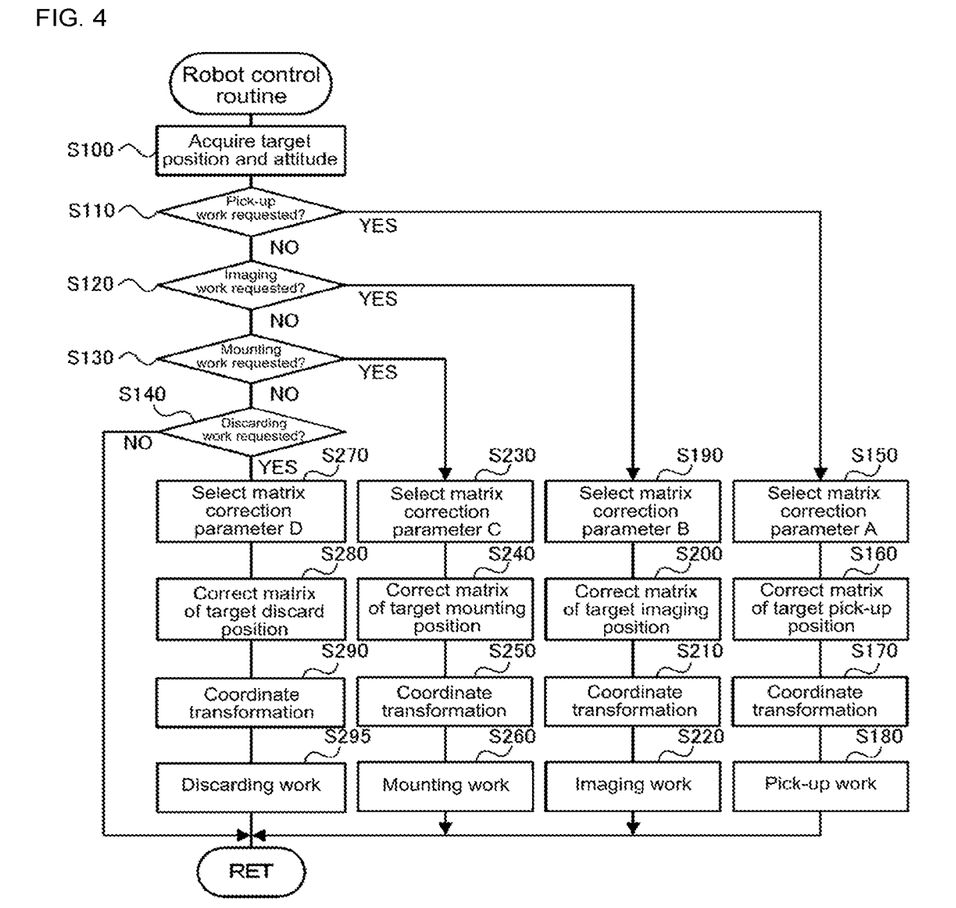
FIG. 4 is a flowchart illustrating an example of a robot control routine.

FIG. 4 is a flowchart illustrating an example of a robot control routine executed by control device 70. The routine is repeatedly executed at a predetermined interval. When the robot control routine is executed, CPU 71 of control device 70 first acquires the target position and the posture (S100), and determines whether any of a pick-up work, an imaging work, a mounting work, and a discarding work is requested (S110 to S140). Here, in the present embodiment, the target position and the posture are the position (target pick-up position) and the posture of the end effector at the time of picking up a component when the pick-up work is requested. The target position and posture are the position (target imaging position) and posture of the end effector at the time when the picked-up component passes over the part camera 14 when the imaging work is requested. Further, the target position and the posture are the position (target mounting position) and the posture of the end effector at the time of mounting the picked-up component on board S when the mounting work is requested. The target position is the position (target discarding position) and posture of the end effector at the time when the picked-up component is discarded into discard box 15 when the discarding work is performed. When CPU 71 determines that none of the pick-up work, the imaging work, the mounting work, or the discarding work is requested, CPU 71 ends the robot control routine.

In S110, when the CPU 71 determines that the pick-up work is requested, matrix correction parameter A is selected from multiple matrix correction parameters A to D (S150). Next, CPU 71 performs matrix correction to correct the acquired target position (target pick-up position) using matrix correction parameter A (S160). Subsequently, CPU 71 sets the target angles of the respective joints (first to fifth joints 41 to 45) by coordinate-transforming the corrected target position and posture (S170). The coordinate transformation can be performed using, for example, well-known DH parameters. Then, CPU 71 performs the pick-up work for picking up a component by driving and controlling the corresponding motors (first motors 51 to 55) based on the set target angles (S180), and ends the robotic control routine. Here, when the pick-up work is performed, CPU 71 causes the end effector to hold the component when the end effector reaches the target position and posture.

In S120, when CPU 71 determines that the imaging work is requested, matrix correction parameter B is selected from multiple matrix correction parameters A to D (S190). Next, CPU 71 performs matrix correction to correct the acquired target position (target imaging position) matrix correction parameter B (S200). Then, CPU 71 performs coordinate transformation (S210) on the corrected target position and posture, performs an imaging work of driving the corresponding motor and capturing an image of the component (S220), and ends the robotic control routine. Here, when the imaging work is performed, CPU 71 causes part camera 14 to capture the component held by the end effector when the end effector reaches the target position and posture. Then, CPU 71 processes the captured image to determine positional deviation and posture of the component, and offsets the target position (target mounting position) in the mounting work. CPU 71 also determines whether an error of the component not being capable of being mounted has occurred based on the captured image, and if it is determined that an error has occurred, CPU 71 skips the mounting work and shifts to the discarding work.

In S130, when CPU 71 determines that the mounting work is requested, matrix correction parameter C is selected from multiple matrix correction parameters A to D (S230). Next, CPU 71 performs matrix correction to correct the offset target position (target mounting position) using matrix correction parameter C (S240). Then, CPU 71 performs coordinate-transformation on the corrected target position and posture (S250), performs the mounting work of mounting the component by driving the corresponding motor (S260), and ends the robot control routine. When the mounting work is performed, CPU 71 causes the end effector to release the holding of the component such that the component is mounted on board S when the end effector reaches the target position and posture.

In the S140, when CPU 71 determines that the discarding work is requested, matrix correction parameter D is selected from multiple matrix correction parameters A to D (S270). Next, CPU 71 performs matrix correction to correct the acquired target position (target discard position) using matrix correction parameter D (S280). Then, the CPU 71 performs coordinate transformation on the corrected target position and posture in the same manner as in S170 and S180 (S290), performs the discarding work of discarding the component by driving the corresponding motor (S295), and ends the robot control routine. When the discarding work is performed, CPU 71 causes the end effector to release the holding of the component such that the component is accommodated in discard box 15 when the end effector reaches the target position and posture.

Figure 5:
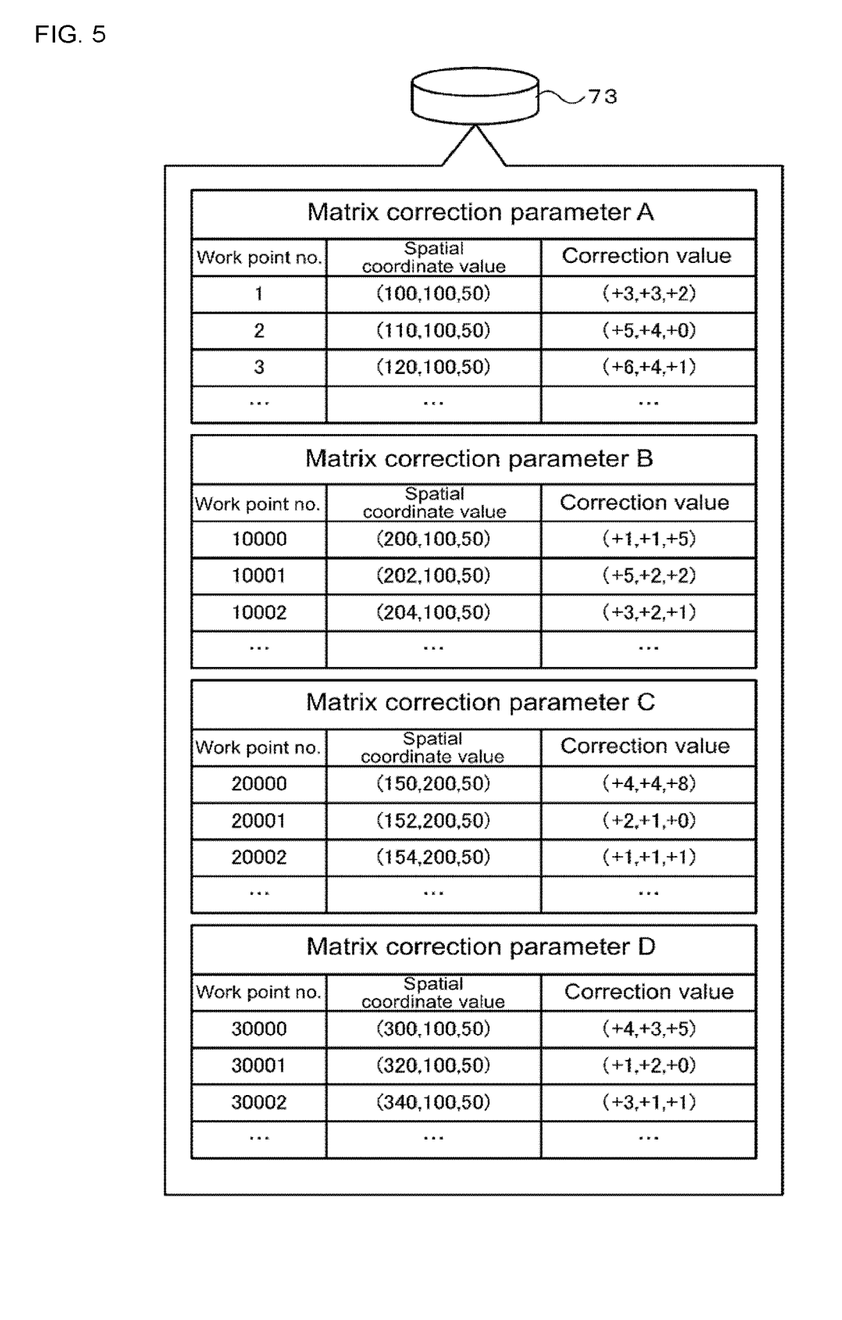
FIG. 5 is an explanatory diagram illustrating an example of a matrix correction parameter.

FIG. 5 is an explanatory diagram illustrating an example of matrix correction parameters A to D. As illustrated in the figure, each of matrix correction parameters A to D is a matrix in which identification information (work point number) of a work point, a spatial coordinate value, and a correction value (three-dimensional offset amount) are associated with each other, and matrix correction parameters A to D are stored in HDD 73. Matrix correction can be performed by deriving a correction value at a target position from correction values of multiple work points around the target position using a well-known interpolation method such as linear interpolation, and offsetting the target position with the derived correction value. Alternatively, the matrix correction may be performed by offsetting the target position with the correction value of the nearest work point from the target position.

Matrix correction parameters A to D have different numbers of data. In the present embodiment, matrix correction parameter B used for the correction of the target imaging position and matrix correction parameter C used for the correction of the target mounting position have a narrower pitch between the work points (the number of data is larger) than matrix correction parameter A used for the correction of the target sampling position, and therefore, the correction accuracy of the target position is high. Since matrix correction parameter D used for correction of the target discard position has a larger pitch between the work points than matrix correction parameter A (the number of data is small), the correction accuracy of the target position is low.

Figure 6:
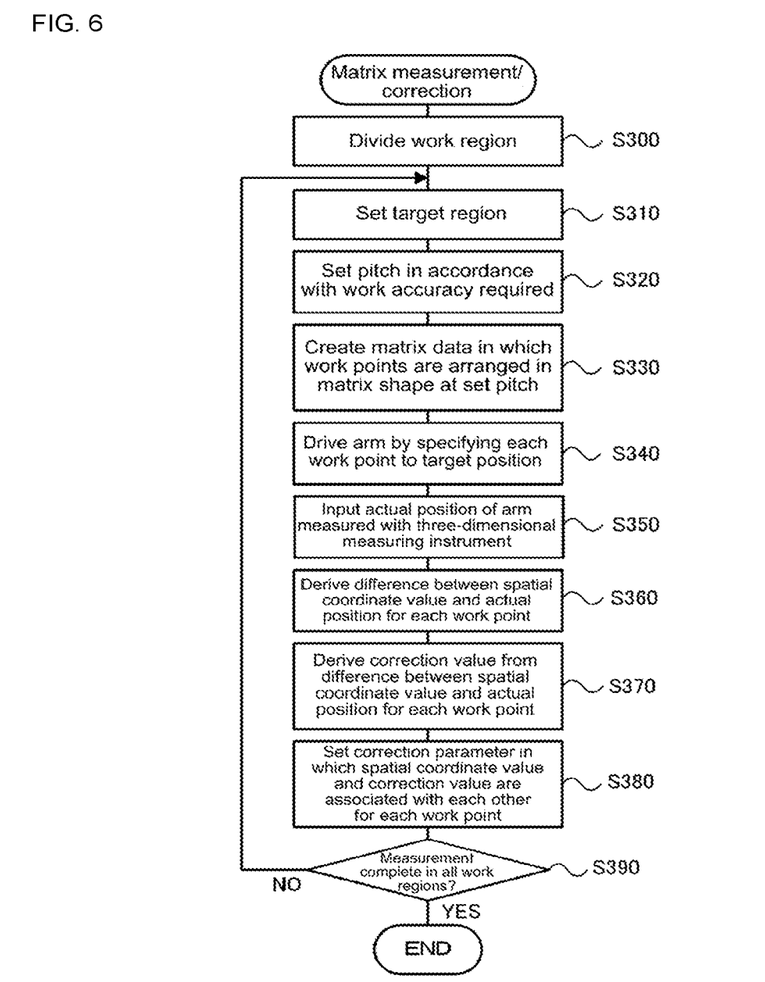
FIG. 6 is an explanatory diagram illustrating an example of a procedure of matrix measurement/correction.
Figure 7:
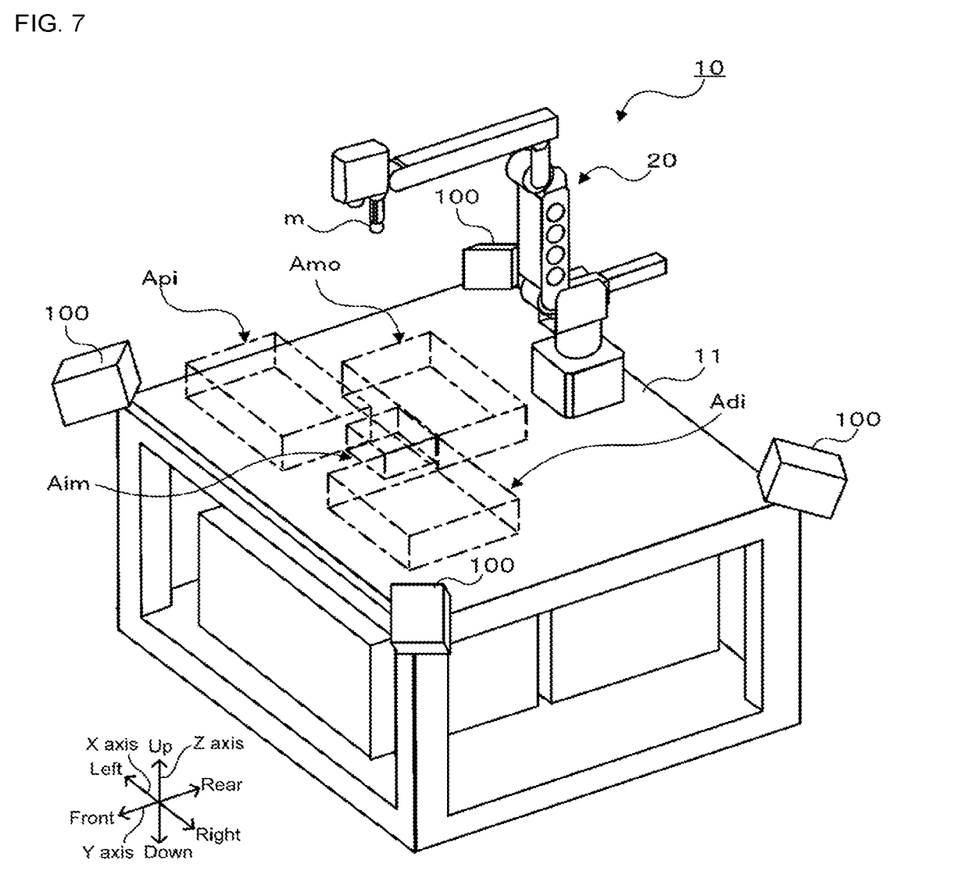
FIG. 7 is an explanatory diagram illustrating a state in which three-dimensional measurement is performed on marker m using three-dimensional measuring instrument 100.
Figure 8A:
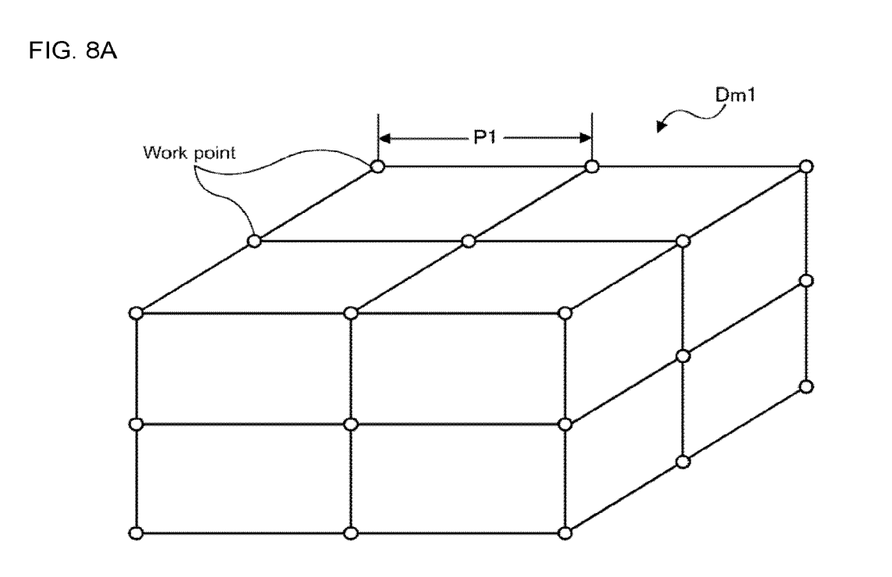
FIG. 8A is an explanatory diagram illustrating an example of matrix data Dm1.
Figure 8B:
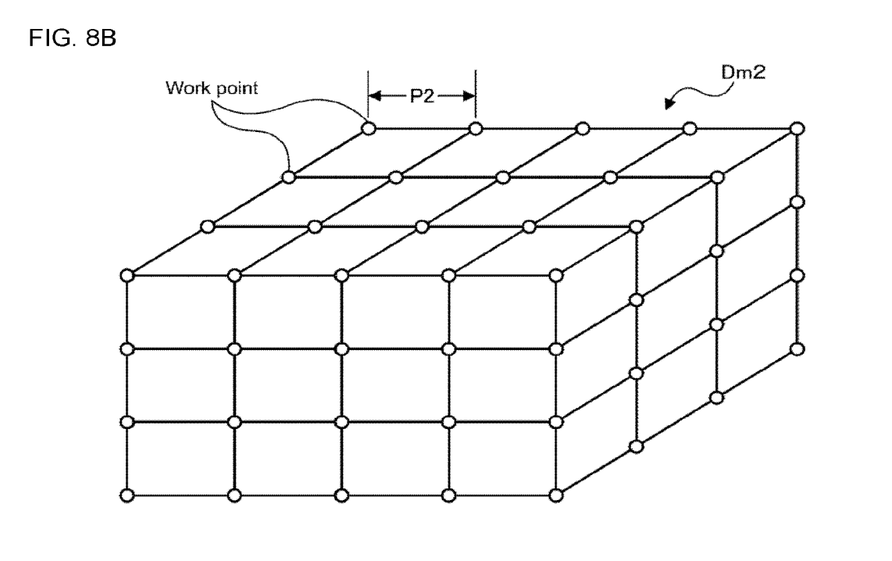
FIG. 8B is an explanatory diagram illustrating an example of matrix data Dm2.
Figure 8C:
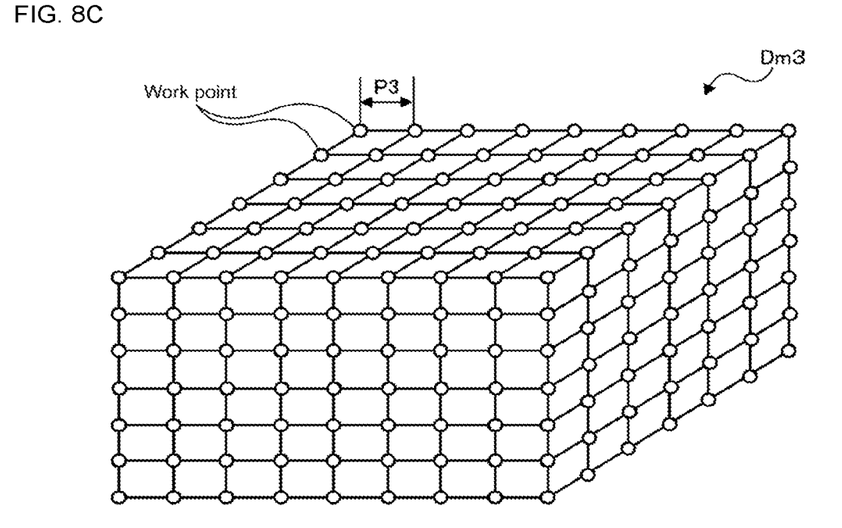
FIG. 8C is an explanatory diagram illustrating an example of matrix data Dm3.

The following description explains a procedure of matrix measurement/correction for deriving matrix correction parameters A to D used for correction of the target position. FIG. 6 is an explanatory diagram illustrating an example of a procedure of matrix measurement/correction. The matrix-measurement corresponds to S300 to S360 of FIG. 6. Matrix correction includes S370 and S380 of FIG. 6, and S150, S160, S190, S200, S230, S240, S270, and S280 of FIG. 4. FIG. 7 is an explanatory diagram illustrating a state in which three-dimensional measurement is performed on marker m using three-dimensional measuring instrument 100. In the figure, region Api is a pick-up work region in which component supply device 13 is a work target object. Region Aim is an imaging work region in which part camera 14 is a work target object. Region Amo is a mounting work region in which board S is a work target object. Region Adi is a discarding work region in which discard box 15 is a work target object. As illustrated in FIG. 7, as preparation for matrix measurement, the operator attaches measurement marker m to the tip link and installs three-dimensional measuring instrument 100 at the corner of work table 11. Three-dimensional measuring instrument 100 can use a laser tracker or a motion capture. When matrix measurement/correction is instructed, CPU 71 of control device 70 first divides the movable region of robot 20 into multiple regions (S300). In the present embodiment, as illustrated in FIG. 7, CPU 71 divides the movable region into pick-up work region Api, imaging work region Aim, mounting work region Amo, and discarding work region Adi. Each region can be changed to a range corresponding to the size of the work target object, that is, component supply device 13, part camera 14, board S, or discard box 15. Next, CPU 71 sets any of pick-up work region Api, imaging work region Aim, mounting work region Amo, and discarding work region Adi to be the target region (S310). Subsequently, CPU 71 sets the data pitch in accordance with the work accuracy required for the target region (S320), and creates matrix data in which the work points are arranged in a matrix at the set data pitch (S330). In the present embodiment, the positional accuracy required for imaging work region Aim and mounting work region Amo is higher than the positional accuracy required for the pick-up work region Api. This is because, on one hand, minimization is required for the deviation of the mounting position of the component in order to prevent mounting error, however, on the other hand, even if a slight deviation occurs in the pick-up position of the component, the mounting work can be performed after correcting the positional deviation when the positional deviation can be recognized by the imaging work. In the present embodiment, the positional accuracy required for the discarding work region Adi is lower than the positional accuracy required for pick-up work region Api. This is because discard box 15 needs only to accommodate a component in which an error has occurred, and a slight positional deviation does not cause a problem. FIGS. 8A to 8C are explanatory diagrams illustrating examples of matrix data Dm1 to Dm3. FIG. 8A illustrates matrix-data Dm1 in which the pitches between the working points have value P1. FIG. 8B shows matrix-data Dm2 in which the pitches between the working points have value P2. FIG. 8C illustrates matrix-data Dm3 in which the pitches between the working points have value P3. As illustrated in the figures, among matrix data Dm1 to Dm3, matrix data Dm1 has the widest pitch and the smallest number of working points per unit space. On the other hand, matrix data Dm3 has the narrowest pitch and the largest number of working points per unit space. When the target region is the imaging work region Aim or the mounting work region Amo, CPU 71 creates matrix data Dm3. When the target region is the pick-up work region Api, CPU 71 creates matrix data Dm2. When the target region is the discarding work region Adi, CPU 71 creates matrix data Dm1.

After creating the matrix data, CPU 71 designates spatial coordinate values of the respective working points in the matrix data as the target position, and controls arm 22 (first to fifth motors 51 to 55) so as to move marker m to the designated target position (S340). Then, CPU 71 inputs the actual position of marker m measured by three-dimensional measuring instrument 100 (S350). Next, CPU 71 derives the difference between the spatial coordinate value and the actual position of input marker m for each working point (S360). When matrix measurement is performed in this manner, CPU 71 derives correction values (offset amounts) from the derived difference (S370). Then, the CPU 71 sets a matrix correction parameter in which the spatial coordinate value and the correction value are associated with each other for each working point (S380).

After setting the matrix correction parameter for the target region in this manner, CPU 71 determines whether the matrix measurement/correction has been completed in all the working regions (S390). When CPU 71 determines that the matrix measurement/correction has been completed in all the working regions, the procedure is returned to S310 and S320 to S380 processes are repeated for the next target region. On the other hand, when CPU 71 determines that the matrix measurement/correction has been completed in all the working regions, the matrix measurement/correction ends.

As described above, the matrix measurement/correction is performed by dividing the movable region of robot 20 into multiple regions, creating matrix data such that the work points are aligned at a data pitch according to the positional accuracy required for each region so as to derive the matrix correction parameters. Here, as the data pitch between the work points set in the matrix measurement/correction is finer, the correction accuracy of the matrix correction parameter derived in the matrix measurement/correction becomes higher. However, in this case, matrix measurement/correction takes a long time to execute. The matrix correction parameters also increase the number of data and increase the required storage capacity. In the present embodiment, since the data pitch is set according to the positional accuracy required for each of the multiple regions, it is possible to reduce the number of data of matrix correction parameter D in the work region (discarding work region Adi) in which high positional accuracy is not required. Therefore, according to the present embodiment, the time taken for matrix measurement/correction can be shortened, and the required storage capacity can be reduced. On the other hand, in the present embodiment, since matrix correction parameters B and C are derived by creating the matrix data at a fine data pitch for the work regions (imaging work region Aim and the mounting work region Amo) in which high positional accuracy is required, it is possible to realize the request for high positional accuracy.

Figure 9:
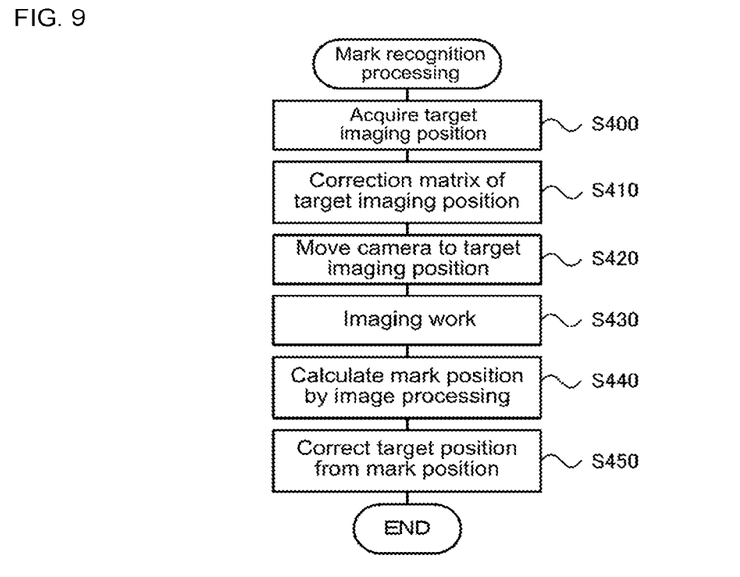
FIG. 9 is a flowchart illustrating an example of a mark recognition process.

FIG. 9 is a flowchart illustrating an example of a mark recognition process executed by control device 70. The mark recognition process may be performed, for example, prior to performing S150 when the pick-up work is requested in S100 in the robotic control routine of FIG. 4. The mark recognition process may be performed prior to performing S190 when the imaging work is requested in S110 in the robotic control routine. The mark recognition process may be performed prior to performing S230 when the mounting work is required in S120 in the robot control routine. When the mark recognition process is performed, CPU 71 of control device 70 first acquires a target imaging position when mark camera 24 captures an image of a mark M attached to the work target object (S400), where the work target object is component supply device 13 when the pick-up work is requested. The work target object is part camera 14 when the imaging work is requested. The work target object is board S when the mounting work is requested. As illustrated in FIG. 1, in the present embodiment, one mark M is provided on the upper face of component supply device 13 (tape feeder). Two marks M are provided on the upper face of part camera 14. In addition, four marks M are attached to corners of the upper face of board S. In the present embodiment, a mark M is not attached to discard box 15 as a work target object when the discarding work is performed, but a mark M may be attached. Subsequently, CPU 71 performs matrix-correction of the acquired target imaging position (S410). Matrix correction is performed using matrix correction parameter A when the pick-up work is requested. The matrix correction is performed using matrix correction parameter B when the imaging work is requested. The matrix correction is performed by using matrix correction parameter C when the mounting work is requested. CPU 71 performs coordinate transformation on the corrected target imaging position and controls driving of the motors (first to fifth motors 51 to 55), thereby moving mark camera 24 to target imaging position (S420). Next, CPU 71 drives mark camera 24 to capture the mark M (S430). CPU 71 also processes the captured image to calculate the positions of the mark M (S440). The position of the mark M is calculated based on the position (target imaging position) of the mark camera 24 at the time of capturing. Then, CPU 71 corrects the target position from the calculated position of the mark M (S450), and ends the mark recognition process. As a result, the target position reflects the relative positional relationship between robot 20 (arm 21) and the work target object (component supply device 13, part camera 14, and board S), and therefore, the positional accuracy with respect to robot 20 is improved. Here, robot 20 can obtain more accurate information for the relative positional relationship with the work target object when the number of the marks M recognized in the work target object is large, as compared with the case where the number of the marks M recognized in the work target object is small. For this reason, the work target object of the imaging work region Aim (part camera 14) and the work target object of the mounting work region Amo (board S), which are required to have higher positional accuracy than that of the pick-up work Api, are provided with more marks M than the work target object (component supply device 13) of the pick-up work region Api. The same number of marks M may be attached to the work target object regardless of the required positional accuracy.

Here, a correspondence relationship between the main elements of the present embodiment and the main elements described in the disclosure will be described. That is, arm 22 (first to sixth links 31 to 36) corresponds to a robot arm, the motor (first to fifth motors 51 to 55) corresponds to an actuator, HDD 73 corresponds to a storage device, and control device 70 corresponds to the control device.

In the present embodiment described above, the storage device (HDD 73) stores matrix correction parameters A to D for each of multiple work regions segmented as regions in which work on the work target object is performed in the movable region of arm 21. When the operation is instructed with the designation of the target position, control device 70 acquires the matrix correction parameter corresponding to the work region to which the designated target position belongs among the multiple work regions. Then, control device 70 corrects the target position using the acquired matrix correction parameter. The matrix correction parameter may be set to correction accuracy required for each of multiple work regions, and excessive correction accuracy is unnecessary. Therefore, according to the present embodiment, it is possible to ensure necessary and sufficient accuracy when the work robot is operated by designating the target position.

In addition, in the present embodiment, the storage device (HDD 73) stores matrix correction parameters A to D in which the spatial coordinate values and the correction values are associated with multiple work points arranged in a matrix at pitches required for each of the multiple of work regions. Therefore, according to the present embodiment, it is possible to reduce the number of data of the matrix correction parameter corresponding to the work region having low required work accuracy among the multiple work regions. As a result, the storage capacity of the storage device can be reduced.

In addition, in the present embodiment, control device 70 recognizes the position of the mark M attached to the work target object, that is, component supply device 13 or substrate S, and corrects the target position based on the recognized position of the mark M. As a result, in the present embodiment, since the target position reflects the relative positional relationship between robot 20 (arm 21) and the work target object, the positional accuracy with respect to robot 20 is improved.

It is needless to say that the present disclosure is not limited to the above-mentioned embodiments, and may be implemented in various forms as long as it falls within the technical scope of the present disclosure.

For example, in the embodiment described above, the mark recognition processing for recognizing the position of the mark M attached to the work target object is executed to reflect the relative positional relationship between the robot 20 and the work target object to the target position, but such mark recognition processing may not be executed.

In the embodiment described above, the robot 20 has a joint of 5 axes, but may have a joint of 4 axes or less, or may have a joint of 6 axes or more. In addition, although the robot 20 has only a rotation/rotation joint, it may have a linear movement joint.

As described above, a work robot of the present disclosure includes a multi-joint type robot arm, an actuator configured to drive each joint of the robot arm, a storage device configured to store a correction parameter for correction accuracy required for each of multiple work regions segmented as regions in which work on a work target object is performed in a movable region of the robot arm, and a control device configured to control the actuator when work is instructed with designation of the target position by acquiring, from the storage device, a correction parameter corresponding to a work region, to which the designated target position belongs, among the multiple work regions, and by correcting the target position using the acquired correction parameter.

In the work robot, the storage device may store the correction parameter for the number of data required for each of the multiple work regions. This makes it possible to ensure necessary and sufficient work accuracy in each of the multiple work regions, while reducing the number of correction parameter data corresponding to the work region for which high work accuracy is not required.

In this case, the storage device may store, as the correction parameter, a correction parameter in which the spatial coordinate value and the correction value are associated with multiple work points arranged in a matrix at pitches required for each of the multiple work regions, and the control device may perform matrix correction to correct the target position using the correction parameter corresponding to the work region to which the target position belongs, when the work is instructed with designation of the target position. In this case, even if an error is included in the robot arm, the robot arm can be moved to the target position more accurately without being affected by the error.

In the work robot of the present embodiment, the robot arm may include a recognition device configured to recognize a mark provided on the work target object, and the control device may control the actuator by correcting the target position based on the position of the mark recognized by the recognition device.

In this case, the relative positional relationship between the work target object and the robot arm is ensured, and the work accuracy of the work performed on the work target object can be further improved. In this case, the work target object may be provided with a required number of marks for each of multiple work regions. The larger the number of marks to be recognized, the more accurately the work robot can specify the relative positional relationship with respect to the work target object. Therefore, by providing the work target object with a required number of marks for each of the multiple work regions, necessary and sufficient work accuracy can be ensured for each of the multiple work regions.

The work position correction method of the present disclosure is a work position correction method for guaranteeing working accuracy when a multi-joint type work robot is operated by designating a target position, including setting multiple work regions as regions in which work on a work target object is performed in a movable region of the work robot, setting a correction parameter for correction accuracy required for each of the multiple work regions, and correcting the target position using a correction parameter corresponding to a work region which belongs to the target position among the set correction parameters to control the operation of the work robot.

In the work position correction method, the work region may be changed according to the size of the work target object. In this case, it is possible to set a work region in a range suitable for the size of the work target object.

The work position correction method may further include setting a required pitch for each of the multiple work regions, setting a correction parameter in which a spatial coordinate value and a correction value are associated with multiple work points arranged in a matrix at the set pitch, and performing matrix correction to correct the target position using the correction parameter corresponding to the work region which belongs to the target position among the set correction parameters. In this case, even if an error is included in the robot arm, the robot arm can be moved to the target position more accurately without being affected by the error.

INDUSTRIAL APPLICABILITY

The present disclosure can be applied to a manufacturing industry of a work robot and the like.

REFERENCE SIGNS LIST

10: robot system
11: work table
12: board conveyance device
13: component supply device
14: part camera
15: discard box
20: robot
22: arm
24: mark camera
31 to 36: first to sixth links
41 to 45: first to fifth joints
51 to 55: first to fifth motors
61 to 65: first to fifth encoders
70: control device
71: CPU
72: ROM
73: HDD
74: RAM
75: drive circuit
76: input device
77: output device
100: three-dimensional measuring instrument
m: marker
M: mark
S: board.

The invention claimed is:

1. A work robot comprising:
a multi joint type robot arm;
an actuator configured to drive each joint of the robot arm;
a storage device configured to store correction parameters for correction accuracy required for each of multiple work regions segmented as regions in which work on a work target object is performed in a movable region of the robot arm; and
a control device configured to control the actuator when the work is instructed with designation of a target position, by acquiring, from the storage device, a correction parameter corresponding to a work region, to which the target position belongs, among the multiple work regions, and by correcting the target position using the correction parameter,
wherein the correction parameters include a spatial coordinate value and a correction value associated with multiple work points within the respective work region that are arranged in a matrix at a predetermined pitch which corresponds to the correction accuracy required for each of the multiple work regions.

2. The work robot of claim 1, wherein the storage device stores correction parameters as a number of data points required for each of the multiple work regions.

3. The work robot according to claim 2, wherein the control device performs matrix correction to correct the target position using the correction parameter corresponding to the work region to which the target position belongs, when the work is instructed with the designation of the target position.

4. The work robot according to claim 1,
wherein the robot arm has a recognition device configured to recognize a mark provided on the work target object, and
wherein the control device is configured to control the actuator by correcting the target position based on a position of the mark recognized by the recognition device.

5. The work robot of claim 4, wherein the work target object is provided with a required number of marks for each of the multiple work regions.

6. The work robot of claim 4, wherein the work regions include a component pick-up work region, an imaging work region, a component mounting work region, and a component discarding work region.

7. The work robot of claim 6, wherein the predetermined pitch for the component mounting work region is greater than the predetermined pitch for the component pick-up work region.

8. A work position correction method for operating a multi-joint type work robot by specifying a target position, comprising:
setting multiple work regions as regions in which work on a work target object is performed in a movable area of the work robot;
setting a correction parameter for correction accuracy required for each of the set multiple work regions; and
correcting the target position using a correction parameter corresponding to a work region which belongs to the target position among the set correction parameters to control the operation of the work robot,
wherein the correction parameters include a spatial coordinate value and a correction value associated with multiple work points within the respective work region that are arranged in a matrix at a predetermined pitch which corresponds to the correction accuracy required for each of the multiple work regions.

9. The work position correction method according to claim 8, wherein the work region is changeable according to a size of the work target object.

10. The work position correction method according to claim 8, further comprising:
setting the predetermined pitch for each of the multiple work regions; and
performing matrix correction to correct the target position using the correction parameter corresponding to the work region which belongs to the target position among the set correction parameters.

* * * * *